(12) United States Patent
Ida et al.

(10) Patent No.: US 11,575,319 B2
(45) Date of Patent: Feb. 7, 2023

(54) DC-DC CONVERTER

(71) Applicant: RENESAS ELECTRONICS CORPORATION, Tokyo (JP)

(72) Inventors: Masayuki Ida, Tokyo (JP); Yasuhiko Kokami, Tokyo (JP); Hideyuki Tajima, Tokyo (JP); Hiroyuki Inoue, Tokyo (JP); Noboru Inomata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 168 days.

(21) Appl. No.: 17/138,881

(22) Filed: Dec. 30, 2020

(65) Prior Publication Data

US 2021/0249958 A1 Aug. 12, 2021

(30) Foreign Application Priority Data

Feb. 12, 2020 (JP) .............................. JP2020-021891

(51) Int. Cl.
*H02M 3/158* (2006.01)
*G05F 1/46* (2006.01)
*H02M 1/00* (2006.01)
*H03K 17/687* (2006.01)
*H03K 19/20* (2006.01)

(52) U.S. Cl.
CPC .............. *H02M 3/158* (2013.01); *G05F 1/46* (2013.01); *H02M 1/00* (2013.01); *H02M 1/0038* (2021.05); *H03K 17/687* (2013.01); *H03K 19/20* (2013.01); *H02M 1/0009* (2021.05); *H02M 1/0032* (2021.05)

(58) Field of Classification Search
CPC ............. H02M 1/0009; H02M 1/0032; H02M 1/0038; H02M 1/10; H02M 1/14; H02M 3/158; G05F 1/46; H03K 17/687; H03K 19/20; G01R 19/00; Y02B 70/10
See application file for complete search history.

(56) References Cited

U.S. PATENT DOCUMENTS 7,170,272 B2 * 1/2007 Yoshida .............. H02M 3/1588
323/224
9,203,316 B2 12/2015 Ide
(Continued)

FOREIGN PATENT DOCUMENTS

| JP | 2002-281743 | A | 9/2002 | |
| JP | 2002281743 | * | 9/2002 | ............ H02M 3/155 |
| JP | 2013-110795 | A | 6/2013 | |

OTHER PUBLICATIONS

Exended Search Report issued in corresponding European Patent Application No. 21156733.4-1201, dated Jun. 24, 2021.

*Primary Examiner* — Matthew V Nguyen
(74) *Attorney, Agent, or Firm* — McDermott Will & Emery LLP

(57) ABSTRACT

A DC-DC converter includes a high-side switch coupled between a first power supply and an output terminal, a low-side switch coupled between a second power supply and the output terminal, an inductor coupled to the output terminal, and a reverse current monitoring circuit that determines that a reverse current from the inductor to the output terminal occurs when the output terminal becomes a high voltage during a state in which the high-side switch and the low-side switch are in a dead time.

8 Claims, 15 Drawing Sheets

(56) References Cited

U.S. PATENT DOCUMENTS

| | | | |
|---|---|---|---|
| 2006/0164057 A1* | 7/2006 | Kudo | H02M 3/1588 |
| | | | 323/282 |
| 2009/0295350 A1* | 12/2009 | Yamada | H02M 3/1588 |
| | | | 323/282 |
| 2009/0302819 A1 | 12/2009 | Lee | |
| 2010/0156366 A1 | 6/2010 | Sakai et al. | |
| 2022/0069712 A1* | 3/2022 | Mondal | H02M 1/0009 |

* cited by examiner

DC-DC CONVERTER

CROSS-REFERENCE TO RELATED APPLICATIONS

The disclosure of Japanese Patent Application No. 2020-021891 filed on Feb. 12, 2020 including the specification, drawings and abstract is incorporated herein by reference in its entirety.

BACKGROUND

The present invention relates to semiconductor device, and more particularly to a DC-DC converter that converts an incoming voltage to a desired voltage.

When power is supplied from a battery to a load such as an ECU (Engine Control Unit) mounted in a vehicle, a DC-DC converter for performing voltage conversion is used.

There are two types of converters in DC-DC converter: a step-up type DC-DC converter and a step-down type DC-DC converter. Both DC-DC converters have switches for controlling the current flowing through the load, and by PWM (Pulse Width Modulation) controlling of the switches, the desired output voltage is obtained.

Patent Document 1 discloses a technique of DC-DC converter, particularly a high power-efficient DC-DC converter considering the reverse current generated when the load is a low power consumption. Referring to FIG. 3 of Patent Document 1, by PWM controlling of a switching element (MP1) connected to the power supply (VDD) and a switching element (MN1) connected to ground (GND), the current flowing through the load is controlled. When MP1 is on and MN1 is off, current flows from VDD through the inductor (L101) to the load and capacitor (C101). When MP1 is off and MN1 is on, current flows to the load through GND and L101 due to the energy stored in L101. At this time, when the current flowing through the load is small (below the critical current), the direction of the current flowing through L101 is reversed. That is, current flows from L101 to the GND direction. In Patent Document 1, this backflow is detected by the comparator 16.

PRIOR-ART DOCUMENT

Patent Document

[Patent Document 1] Japanese Unexamined Patent Application Publication No. 2013-110795

SUMMARY

However, in the technique disclosed in Patent Document 1, since the backflow is detected by the comparator, i.e., the analogue circuit, the circuit size is increased. Furthermore, since it also requires a constant current circuit for the comparator, it leads to an increase in current consumption. Further, when DC-DC converter is mounted in a vehicle, since the noise is likely to enter the ground, the comparator may malfunction and erroneously detect the reverse flow.

Other objects and novel features will become apparent from the description of the specification and drawings.

DC-DC converter according to an embodiment includes a high-side switch connected between the first power supply and the output terminal, a low-side switch connected between the second power supply and the output terminal, an inductor connected to the output terminal, the high-side switch and the low-side switch when the output terminal during the dead time period becomes a high voltage, and a reverse current monitoring circuit for determining that the reverse current from the inductor to the output terminal has occurred.

In semiconductor device according to an embodiment, the reverse current generated in DC-DC converter can be detected without increasing the current consumption and the circuit size.

DETAILED DESCRIPTION

Figure 1:
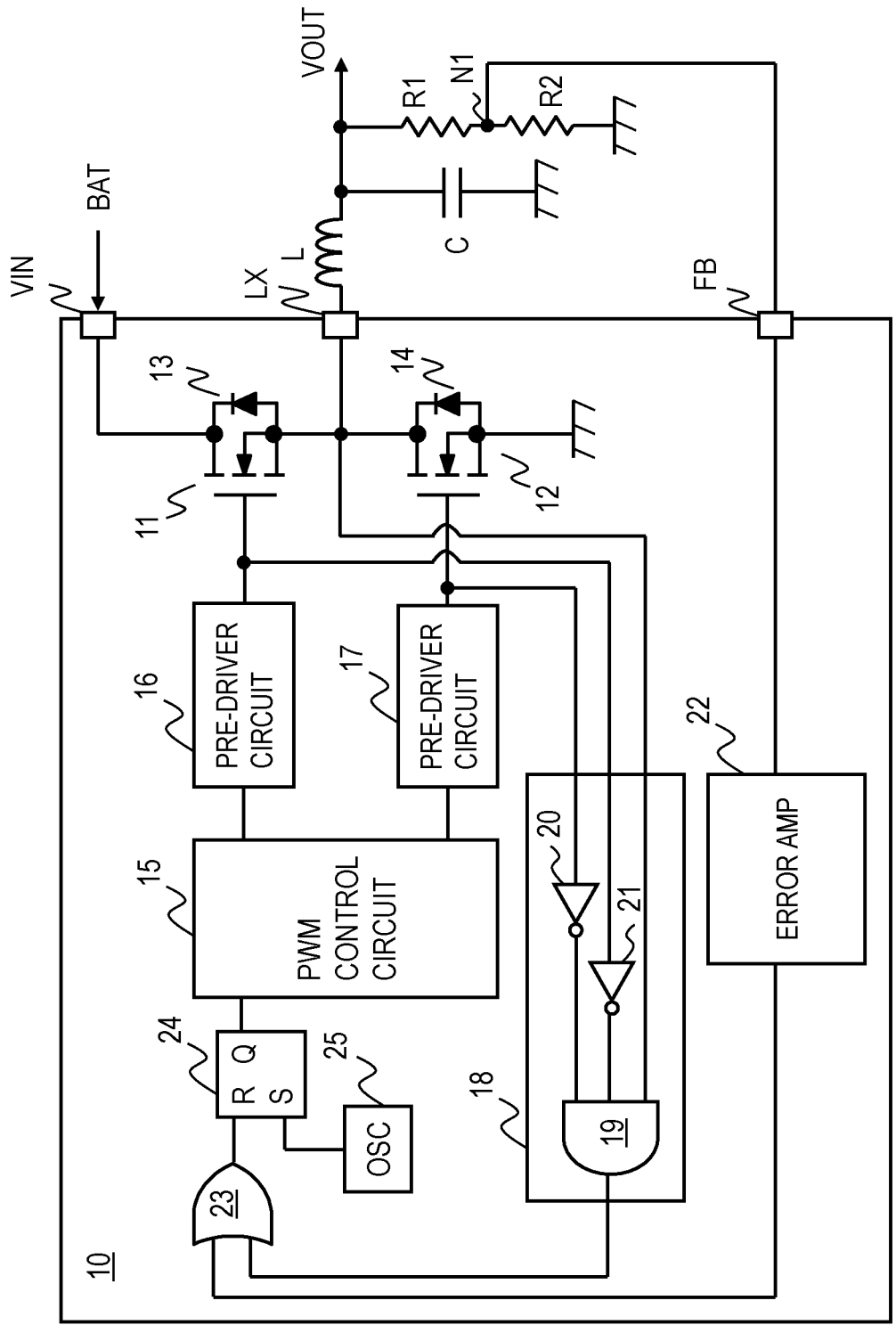
FIG. 1 is a schematic diagram of a semiconductor device according to first embodiment.

Hereinafter, a semiconductor device according to an embodiment will be described in detail by referring to the drawings. In the specification and the drawings, the same or corresponding form elements are denoted by the same reference numerals, and a repetitive description thereof is omitted. In the drawings, for convenience of description, the configuration may be omitted or simplified. Also, at least some of the embodiments may be arbitrarily combined with each other.

First Embodiment

FIG. 1 is a block diagram showing a configuration of a semiconductor device 10 according to first embodiment.

As shown in FIG. 1, semiconductor device 10 includes a high-side switch 11 disposed between the input terminal VIN (first power supply) and the inductor connection terminal LX (output terminal), a low-side switch 12 disposed between the inductor connection terminal LX and ground (second power supply), a PWM control circuit 15, pre-driver circuits 16, 17, a reverse current monitoring circuit 18, an error amplifier (ERROR AMP) 22, a logical sum circuit 23, an RS latch circuit 24, an oscillator (OSC) 25.

A power is supplied to the input terminal VIN. When semiconductor device 10 is mounted in a car, a battery (BAT) is connected to the input terminal VIN. An inductor L is connected to the inductor connection terminal LX A capacitor C and the load are connected to the inductor L, the output-voltage VOUT is supplied to the load. A voltage (voltage VN1 of the node N1) obtained by dividing the output voltage VOUT by the resistor R1 and R2 is inputted to the input terminal FB.

The high-side switch 11 and the low-side switch 12 are NMOS transistors, and have body diodes 13, 14, respectively. The high-side switch 11 and the low-side switch 12 constitute a step-down DC-DC converter. Incidentally, the high-side switch 11 may be a PMOS transistor, but will be described with a NMOS transistor in first embodiment.

The PWM control circuit 15 generates a PWM signal for controlling the gate of the high-side switch 11 via the pre-driver circuit 16. Similarly, the PWM control circuit 15 generates a PWM signal for controlling the gate of the low-side switch 12 via the pre-driver circuit 17.

The oscillator (OSC) 25 determines a frequency of the PWM signal generated by the PWM control circuit 15. The oscillator 25 outputs a logical value of 1 at a predetermined cycle. The output of the oscillator 25 is input to the set (S) terminal of the RS latch circuit 24. The output (Q) of the RS latch circuit 24 is input to the PWM control circuit 15.

Figure 2:
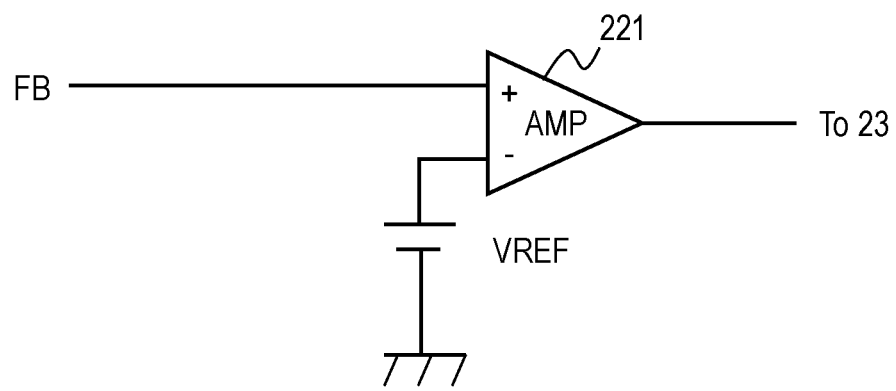
FIG. 2 is a block diagram of a short-circuit protection circuit.

Error amplifier 22 is for determining whether the output voltage VOUT has reached a predetermined voltage. Specifically, as shown in FIGS. 1 and 2, a voltage obtained by dividing the output voltage VOUT by resistors R1, R2, and reference voltage VREF are input to the amplifier (AMP) 221. Resistors R1, R2 and reference voltage VREF may be set to match the voltage to be detected.

Reverse current monitoring circuit 18 has a logical AND circuit 19, NOT circuits 20, 21. Reverse current monitoring circuit 18 is for detecting that the current flows back to semiconductor device 10 from the inductor connecting terminal LX.

The output of the reverse current monitoring circuit 18 and the output of the error amplifier 22 are input to the OR circuit 23. The output of the OR circuit 23 is input to the reset (R) terminal of the RS latch circuit 24.

This first embodiment has features in the PWM control circuit 15, the reverse current monitoring circuit 18, and the RS-latch circuit 24, but prior to explaining these operations, a mechanism in which a reverse current is generated and a basic operation of semiconductor device 10 will be described.

Figure 3:
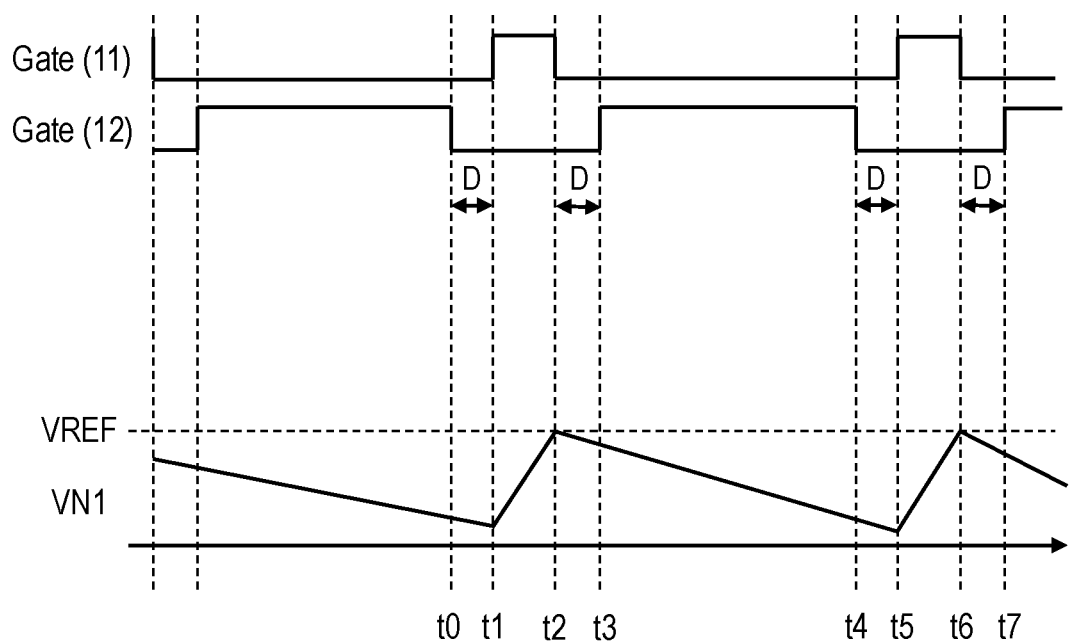
FIG. 3 is an image diagram for explaining the operation of semiconductor device according to first embodiment.

First, the basic operation of semiconductor device 10 will be described. FIG. 3 shows the gate signal of the high-side switch 11, the gate signal of the low-side switch 12 and the voltage of the node N1. The oscillator 25 outputs a logic 1 at times t0 and t4 (one cycle of the oscillator is a period from time t0 to t4). When the oscillator 25 outputs the logic value 1, the output (Q) of the RS latch circuit 24 becomes the logic value 1. After a predetermined time D elapses after the output of the RS latch circuit becomes the logic value 1, the PWM control circuit 15 sets the gate signal of the high-side switch 11 to the logic value 1 via the pre-driver circuit 16 (time t1). Here the predetermined time D is a dead time for avoiding the high-side switch 11 and the low-side switch 12 are turned on at the same time. When the high-side switch 11 is turned on, the output voltage VOUT is increased, the voltage VN1 of the node N1 is also increased.

If the voltage VN1 exceeds reference voltage VREF, the error amplifier 22 outputs a logical value 1 (time t2). When the error amplifier 22 outputs the logic value 1, the RS latch circuit 24 is reset and outputs the logic value 0. Here, the reverse current monitoring circuit 18 is assumed to output a logic value 0. The reverse current monitoring circuit 18 will be described later. When the RS latch circuit 24 outputs the logic value 0, the PWM control circuit 15 sets the gate signal of the high-side switch 11 to the logic value 0 via the pre-driver circuit 16. Since the high-side switch 11 is turned off, the output voltage VOUT drops, the voltage VN1 also drops. Error amplifier 22 outputs a logical value 0 since the voltage VN1 is equal to or less than VREF. The RS latch circuit 24 maintains a logic value of 0.

After the dead time D has elapsed after the output of the RS latch circuit 24 becomes the logic value 0, the PWM control circuit 15 sets the gate signal of the low side switch 12 to the logic value 1 via the pre-driver circuit 17 (time t3). Since the low-side switch 12 is turned on, the output voltage VOUT further drops, the voltage VN1 also drops.

When the oscillator 25 outputs the logic value 1, the output of the RS latch circuit 24 becomes the logic value 1 (time t4). When the output of the RS latch circuit 24 becomes the logic value 1, the PWM control circuit 15 sets the gate signal of the low side switch 12 to the logic value 0 through the pre-driver circuit 17. After the dead time D elapses after the RS latch circuit 24 outputs the logic value 1, the PWM control circuit 15 sets the gate signal of the high-side switch 11 to the logic value 1 via the pre-driver circuit 16 (time t5). Thereafter, the same operation is repeated.

Figure 4:
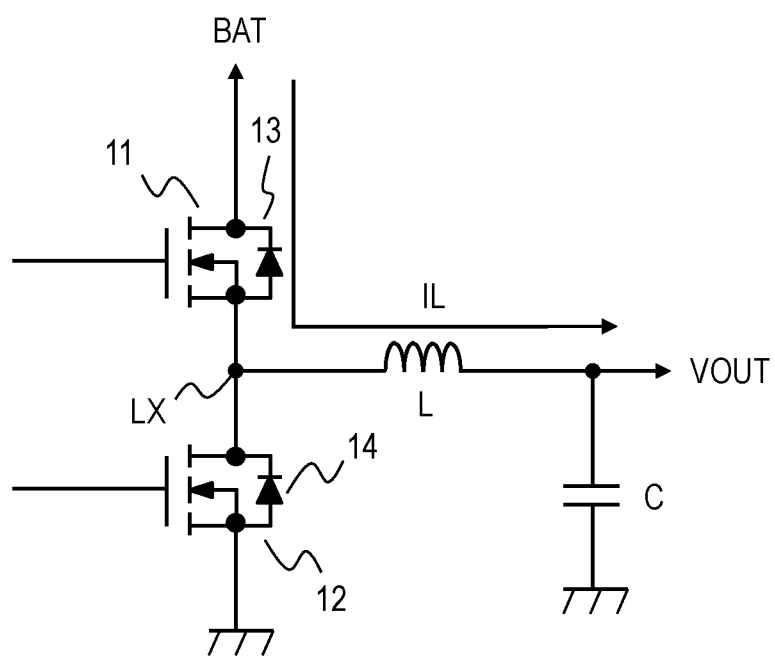
FIG. 4 is an image diagram for explaining the operation of semiconductor device according to first embodiment.
Figure 5:
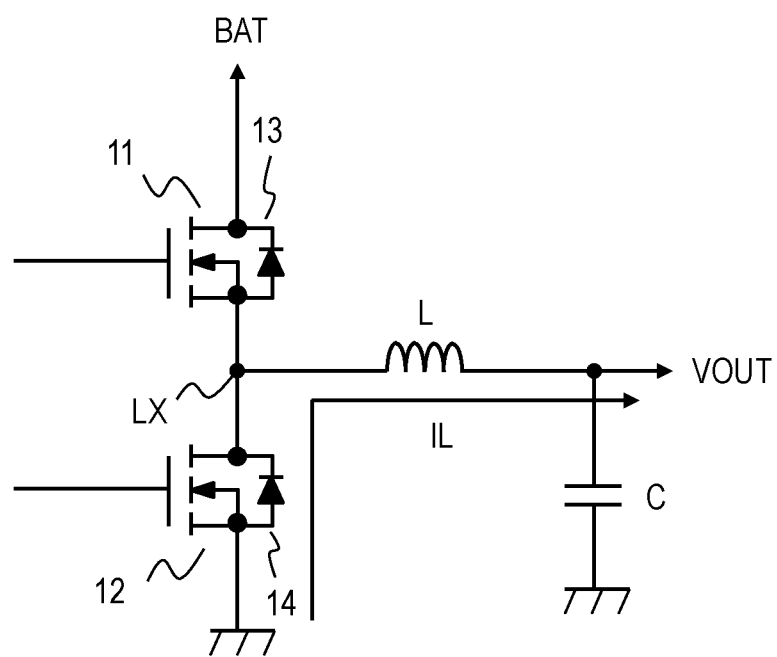
FIG. 5 is an image diagram for explaining the operation of semiconductor device according to first embodiment.

Next, a mechanism by which the reverse current is generated at the terminal LX. First, a case where the load current is large and a current above the critical current flows will be described. FIG. 4 is an image diagram when the high-side switch 11 is turned on, the low-side switch 12 is turned off. Current IL flows from the battery (BAT) to VOUT through the high-side switch 11 and the inductor L. At this time, the inductor L stores energy. FIG. 5 is an image diagram when the high-side switch 11 is turned off and the low-side switch 12 is turned on after FIG. 4. Since the inductor L releases the stored energy, the current IL flows from the ground to VOUT through the inductor L.

Figure 6:
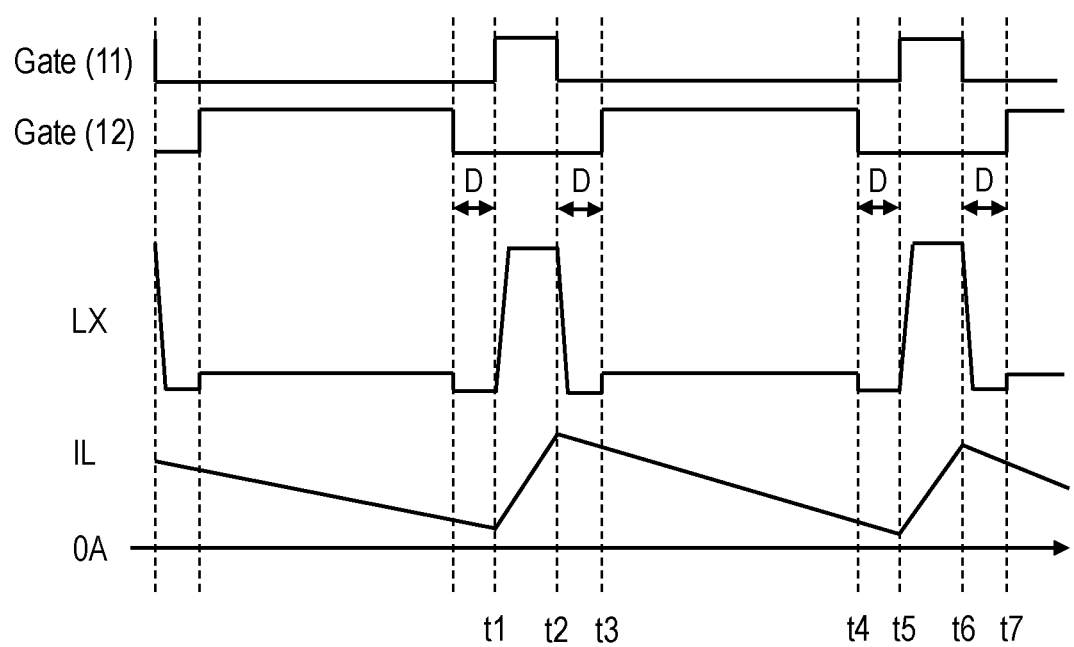
FIG. 6 is a timing chart for explaining the operation of semiconductor device according to first embodiment.

FIG. 6 is a timing chart showing the relationship between the gate signal of the high-side switch 11, the gate signal of the low-side switch 12, the voltage of the inductor L (voltage of the inductor connection terminal LX) and the current IL. When the gate signal of the high-side switch 11 is Hi (high voltage) and the gate signal of the low-side switch 12 is Lo (low voltage), the voltage of the inductor L is Hi and the current IL is increasing (time t1). When both the gate signal of the high-side switch 11 and the gate signal of the low-side switch 12 become Lo, the inductor L releases the stored energy, and the current IL flows (the current IL is decreasing). Current IL at this time flows through the body diode 14. Therefore, the voltage of the body diode L becomes a voltage lower by the amount of the body diode 14 than the ground (time t2). When the gate signal of the high-side switch 11 becomes Lo and the gate signal of the low-side switch 12 becomes Hi, the voltage of the inductor L becomes ground, and the current IL is further decreasing at time t3. When the gate signal of the high-side switch 11 is Lo, the gate signal of the low-side switch 12 is Lo, similarly to time t2, the voltage of the inductor L becomes a voltage lower by the amount of the body diode 14 than ground, the current IL is further decreasing (time t4). Thereafter, the above-described operation is repeated.

As described above, when the load current is large, the direction of the current IL is always one direction (from the inductor connecting terminal LX to VOUT), the reverse current does not occur.

Figure 7:
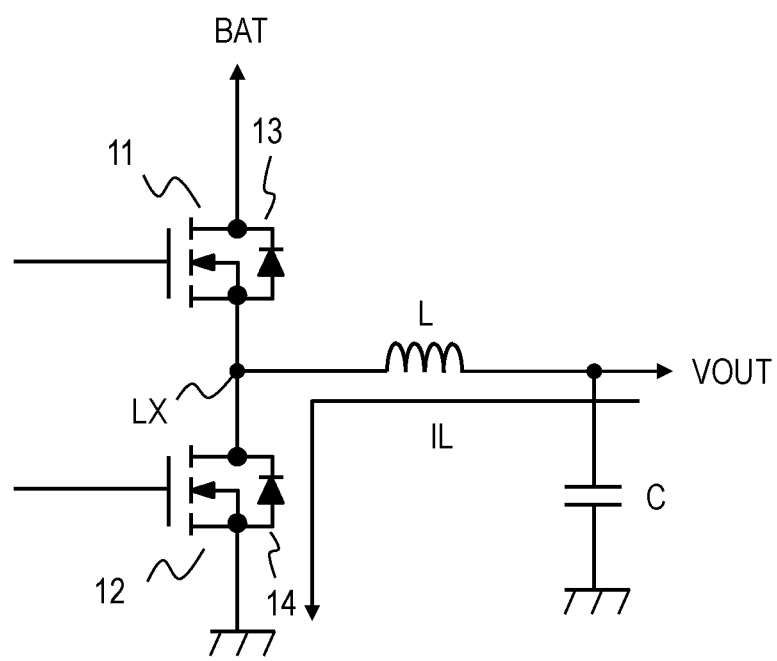
FIG. 7 is an image diagram for explaining the operation of semiconductor device according to first embodiment.

Next, a case where the load current is small and the current below the critical current flows will be described. When the high-side switch 11 is on, the low-side switch 12 is off, and, when the high-side switch 11 is turned off thereafter, the operation is the same as when the load current is large (FIG. 4, FIG. 5). At this time, the current IL flows toward VOUT. FIG. 7 is an image diagram when the high-side switch 11 is turned off and the low-side switch 12 is turned on after FIG. 5. When the inductor L releases the stored energy, the current IL from the inductor L flows to the load and the capacitor C. If the load current is small, since the energy for charging the capacitor C is increased, there is a case where an energy stored in the capacitor C is larger than an energy stored in the inductor L. At this time, by the energy emission of the capacitor C, the current IL flows to ground via the inductor L and the low-side switch 12. That is, the current flows back to semiconductor device 10 from the inductor connecting terminal LX.

Figure 8:
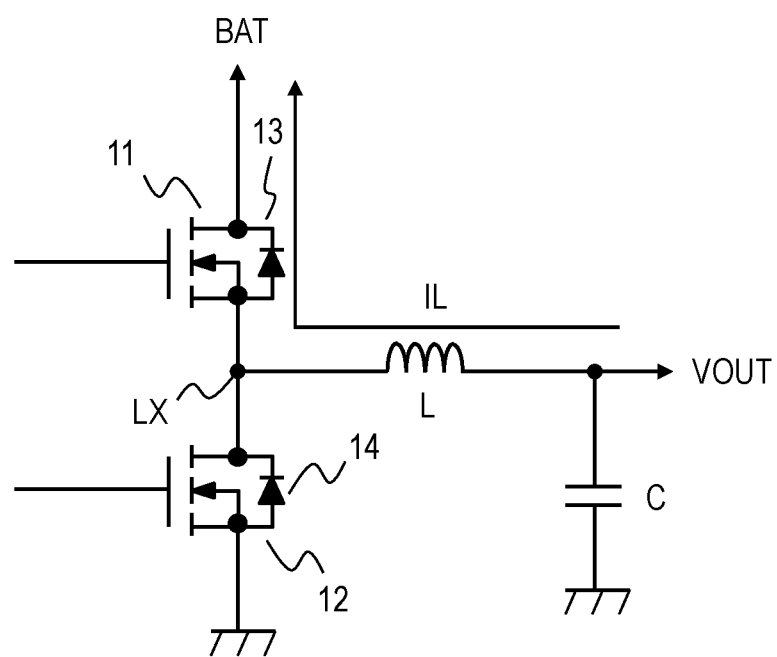
FIG. 8 is an image diagram for explaining the operation of semiconductor device according to first embodiment.

FIG. 8 is an image diagram when the low-side switch 12 is turned off (the high-side switch 11 is also turned off) after FIG. 7. Since the inductor L attempts to continue to flow the current IL by self-induction, the current IL flows through the body diode 13 to the power supply (BAT).

Figure 9:
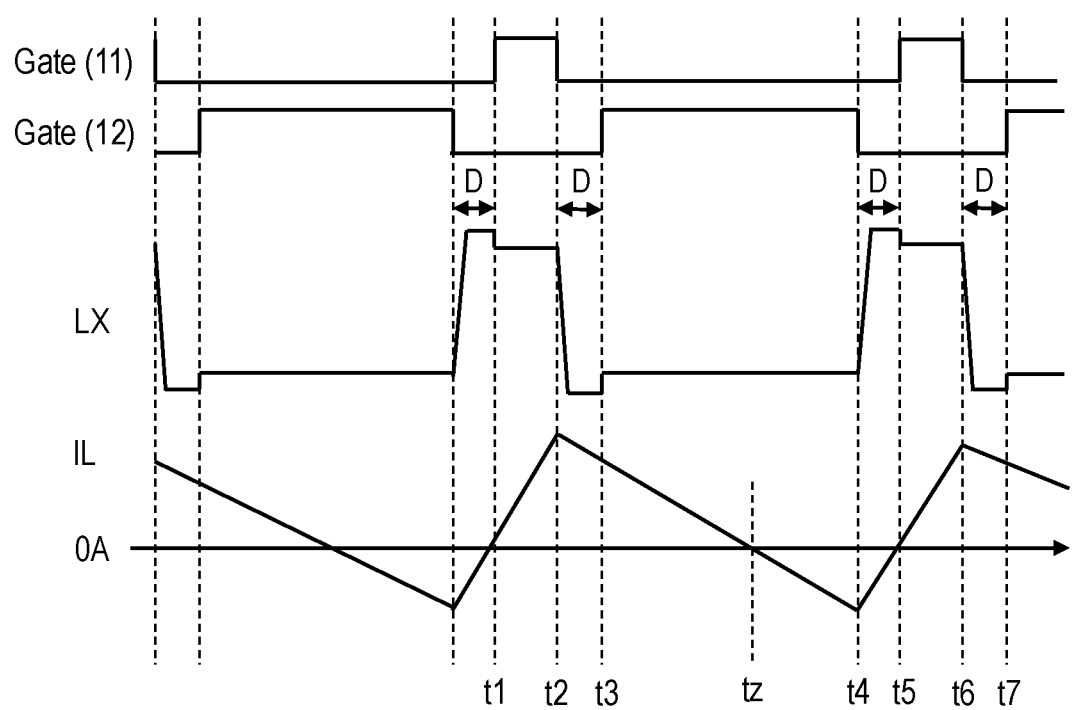
FIG. 9 is a timing chart for explaining the operation of semiconductor device according to first embodiment.

FIG. 9 is a timing chart showing the relationship between the gate signal of the high-side switch 11, the gate signal of the low-side switch 12, the voltage of the inductor L (voltage of the inductor connection terminal LX) and the current IL. When the gate signal of the high-side switch 11 is Hi (high voltage) and the gate signal of the low-side switch 12 is Lo (low voltage), the voltage of the inductor L is Hi and the current IL is increasing (time t1). When both the gate signal of the high-side switch 11 and the gate signal of the low-side switch 12 become Lo, the inductor L releases the stored energy, and the current IL flows (the current IL is decreasing). Current IL at this time flows through the body diode 14. Therefore, the voltage of the inductor L becomes a voltage lower by the amount of the body diode 14 than the ground (time t2). When the gate signal of the high-side switch 11 becomes Lo and the gate signal of the low-side switch 12 becomes Hi, the voltage of the inductor L becomes ground, and the current IL is further decreasing at time t3. Thereafter, as described in FIG. 7, when the load current is small, the reverse current flowing from the inductor L to ground through the low side switch 12 is generated (time tz). When the gate signal of the high-side switch 11 becomes Lo and the gate signal of the low-side switch 12 becomes Lo, the current IL flows to the power supply BAT through the body diode 13 as described with reference to FIG. 8. Therefore, the voltage of the inductor L becomes a voltage higher by the amount of the body diode 13 than the power supply (BAT) (time t4). Thereafter, the above-described operation is repeated.

Here, we consider the difference between the case where the load current is large and the case where the load current is small. Comparing FIGS. 6 and 9, even the same control signal (PWM signal) given to the respective gates of the high-side switch 11 and the low-side switch 12, it can be seen that the voltage of the inductor L (the voltage of the inductor connection terminal LX) differs. In particular, the duty of the voltage is different. For example, when performing voltage conversion by PWM assuming a case where the load current is large, it is expected that a voltage having a duty as shown in FIG. 6 is output. However, when the load current is smaller than the assumed and the reverse current is generated, a voltage having a duty as shown in FIG. 9, i.e. higher duty than FIG. 6 (long period of high voltage) will be generated. This causes an increase of the peak value of the current IL flowing through the inductance L, an increase of ripple of the output voltage and an increase of power consumption.

Therefore, the first embodiment detects the generation of reverse current in small-scale circuitry without using an analogue comparator. Returning to FIG. 1, the present first embodiment will be described. PWM control circuit 15 generates a PWM signal so that the desired conversion voltage is obtained. The generated PWM signal is supplied to the respective gates of the high-side switch 11 and the low-side switch 12 via the pre-driver circuits 16, 17.

Reverse current monitoring circuit 18 has a logical AND circuit 19, NOT circuits 20, 21. The input of the NOT circuit 20 is connected to the gate of the low-side switch 12. The input of the NOT circuit 21 is connected to the gate of the high-side switch 11. Logical AND circuit 19 generates a logical product value by the output values of the NOT circuits 20, 21 and the value of the inductor connection terminal LX. That is, when the gate signals of the high-side switch 11 and the low-side switch 12 are both Lo and the inductor connection terminal LX is Hi, the reverse current monitoring circuit 18 determines that the reverse current occurs and outputs Hi (logical value 1).

Figure 10:
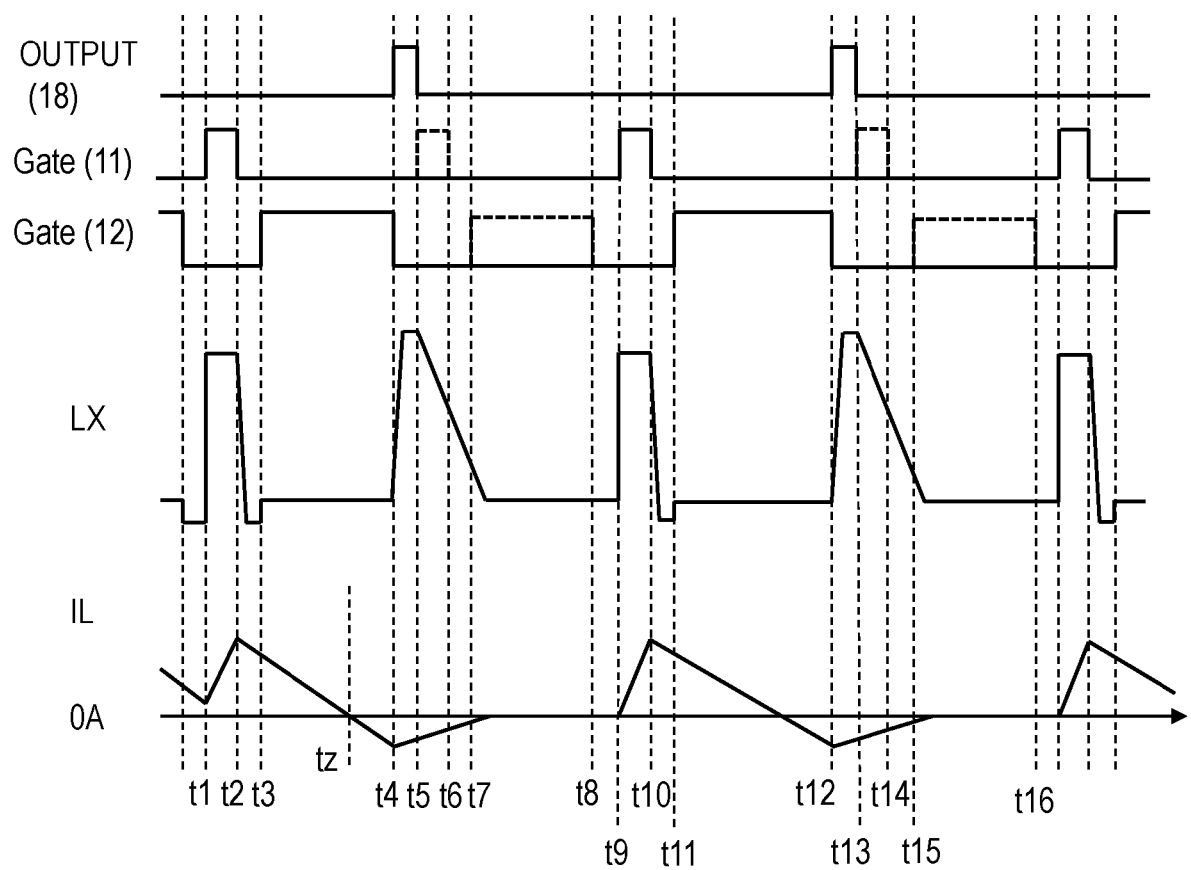
FIG. 10 is a timing chart for explaining the operation of semiconductor device according to first embodiment.

FIG. 10 is used to further explain the present invention. FIG. 10 is a timing chart showing a case where the load current is reduced, the reverse current is generated. Since the times t1 to t3 in FIG. 10 are the same as the times t1 to t3 in FIG. 6, the description thereof is omitted. After time t3, when the load current is reduced, as described in FIG. 9, the reverse current is generated at time tz. When the gate signal of the high-side switch 11 becomes Lo and the gate signal of the low-side switch becomes Lo after the reverse current is generated, as described with reference to FIG. 9, the voltage of the inductor L (the voltage of the inductor connection terminal LX) becomes higher than the power supply (BAT) (time t4). At this time, the reverse current monitoring circuit 18 outputs Hi (logic value 1). That is, the reverse current monitoring circuit 18 detects the reverse current generated when the low-side switch 12 is turned on, based on Hi (logic value 1) appearing in the inductor connection terminal LX when the low-side switch 12 is turned off. Therefore, it is not necessary to directly monitor the voltage of the inductor connection terminal LX and the voltage of the connection node of the load by the analog comparator, it is possible to detect the reverse current by the logical AND circuit 19 and the NOT circuits 20, 21 which are digital circuits.

The first embodiment will be further described with reference to FIGS. 1 and 10. The output of the reverse current monitoring circuit 18 is connected to the RS latch 24 via the OR circuit 23. The error amplifier 22 is also connected to the OR circuit 23. The operation of the error amplifier 22 is as already described. The error amplifier 22 outputs a logical value 0 in the vicinity of time tz when reverse current occurs. As described above, the reverse current monitoring circuit 18 outputs a logic value 1 when the reverse current is detected at time t4 Therefore, the logic value 1 is input to the R (reset) terminal of the RS latch circuit 24.

As described in the basic operation, at time t4, the oscillator 25 outputs a logical value of 1. However, since the reverse current monitoring circuit 18 outputs the logic value 1 at the same timing, the RS latch circuit 24 outputs the logic value 0. Since the RS latch circuit 24 outputs the logic value 0, the PWM control circuit 15 sets the gate signal of the high-side switch 11 to the logic value 0, that is, does not set the logic value 1. Referring to FIG. 10, originally, Hi should be input to the gate of the high-side switch 11 at time t5 to t6 (the waveform of the dotted line), but it remains Lo by the detection of the reverse current. Similarly, although Hi should be input to the gate of the low-side switch 12 at time t7 to t8 (the waveform of the dotted line), it remains Lo. After time t5, by the generation of the PWM signal is stopped, the current IL flowing through the inductor L is gradually 0, the voltage of the inductor connection terminal LX is a ground potential.

At time t8, the oscillator 25 outputs a logic value 1 to the S (set) terminal of the RS latch circuit 24. The RS latch circuit 24 outputs a logic value 1 when a logic value 1 is input to the S terminal. After the dead time D has elapsed after the RS latch circuit 24 becomes the logic value 1, the PWM control circuit 15 sets the gate signal of the high-side switch 11 to the logic value 1 (time t9). After t9, the same operation is repeated. The periods t5 to t8 and t13 to t16 are mask periods in which PWM is not generated.

Here, the effect of stopping the PWM generation after the reverse current detection will be described. Comparing the time t4-t7 of FIG. 9 and the time t8-t11 of FIG. 10, in FIG. 9, a period in which the voltage of the inductor connection terminal LX is Hi is two cycles (t4-t6) by an influence of the reverse current. On the other hand, in FIG. 10, a period in which the voltage of the inductor connection terminal LX is Hi is one cycle (t9-t10). This shows that the same control as the PWM control when the reverse current is not generated (FIG. 6) can be realized.

In the present first embodiment, the reverse current monitoring circuit 18 is constituted by the logical AND circuit 19, the NOT circuits 20, 21, but is not limited thereto. Any circuit may be used as long as it can detect that the gate signals of the high-side switch 11 and the low-side switch 12 are both Lo and the inductor connection terminal LX is Hi. For example, a logical AND circuit 19 is replaced by a logical OR circuit, and a NOT circuit between the Inductor connection terminal LX and logical OR circuit is disposed. Further, the NOT circuits 20 and 21 are deleted, the gate signals of the low-side switch 12 and the high-side switch 11 are inputted to the logical OR circuit. In this case, when both of the gate signals of the low-side switch 12 and the high-side switch 11 are Lo and the inductor connection terminal LX is Hi, the OR circuit outputs Lo (logic value 0). When the logical OR circuit outputs Lo, it can be determined that the reverse current is occurring.

When using PMOS transistor as the high-side switch 11, when the gate signal of the high-side switch 11 is Hi, the gate signal of the low-side switch 12 is Lo and the inductor connection terminal LX becomes Hi, it is determined that the reverse current is generated.

Alternatively, the reverse current monitoring circuit 18 may be so as to detect that the inductor connection terminal LX becomes Hi during the dead time period. Dead time may be notified from the PWM control circuit 15.

In this first embodiment, the PWM is generated by the control of the oscillator 25, but the present invention is not limited to this. For example, the PWM may be generated by a timer circuit or the like.

As described above, in semiconductor device 10 according to the present first embodiment, the reverse current is detected by monitoring the gate signals of the high-side switch 11 and the low-side switch 12 and the voltage of the inductor connecting terminal LX by the reverse current monitoring circuit 18. This makes it possible to realize a DC-DC converter with reduced current consumption and circuit size.

Further, in the present first embodiment, in response to detecting the reverse current, a masking period in which the PWM is not generated can be set. Thus, it is possible to suppress the ripple increase in the voltage of the inductor LX connection terminal (output voltage).

Second Embodiment

Figure 11:
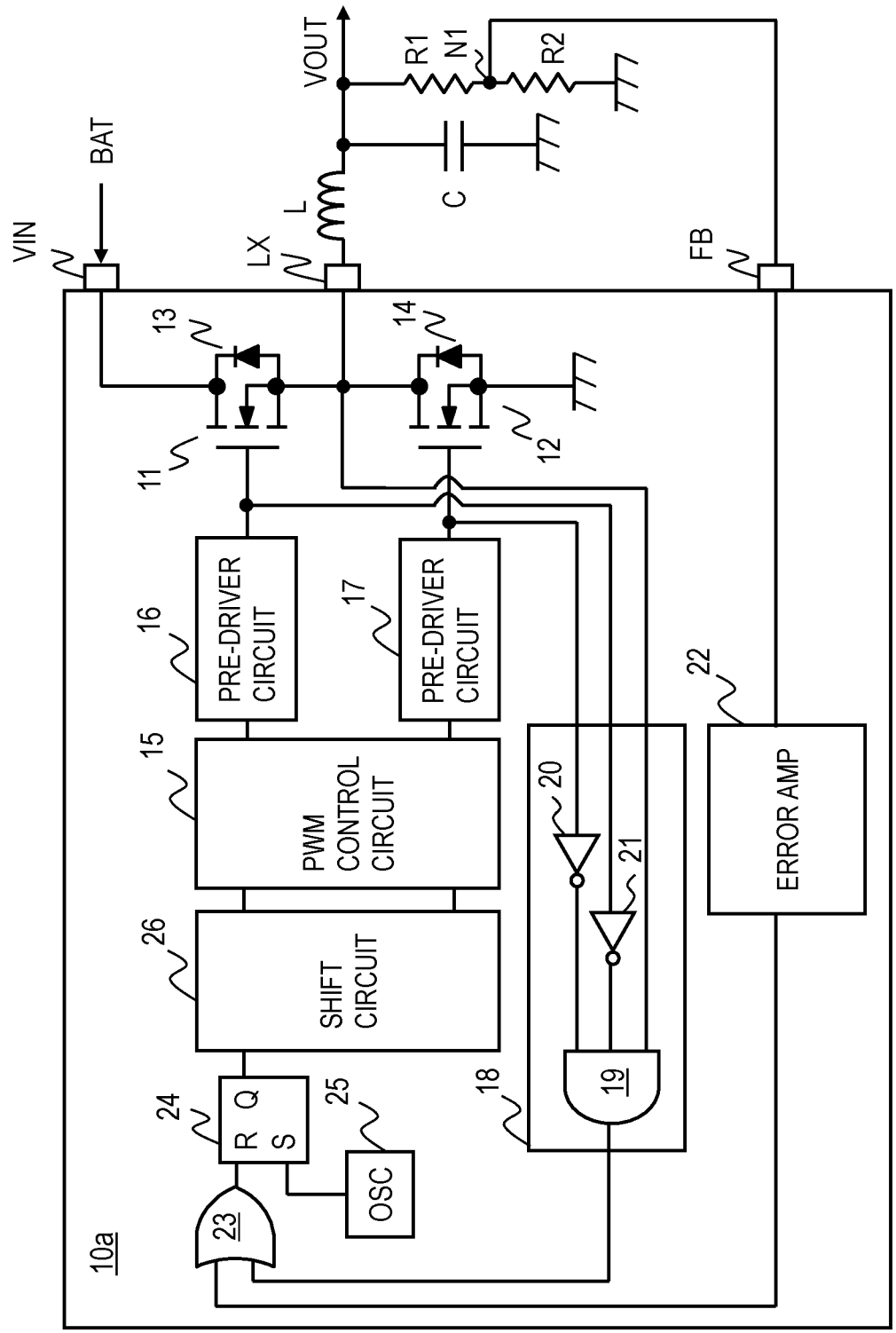
FIG. 11 is a diagram of a semiconductor device according to second embodiment.

FIG. 11 is a block diagram showing a configuration of a semiconductor device 10*a* according to second embodiment. The difference from first embodiment is that a shift circuit 26 is added. The shift circuit 26 may be incorporated in the PWM control circuit 15.

Shift circuit 26, based on the output signal of the RS latch circuit 24, shifts the PWM signal generated by the PWM control circuit 15 by a predetermined amount. The shifted PWM signal is supplied to the respective gates of the high-side switch 11, the low-side switch 12 via the pre-driver circuits 16, 17. The operation other than the shift circuit 26 is the same as that of first embodiment.

Since PWM control circuit 15 generates a PWM signal based on a predetermined timing, i.e., the oscillator 25 and the dead time D, the shift circuit 26 shifts the timing by a predetermined amount. For example, the dead time D of the PWM control circuit 15 may be changed.

Next, the operation of semiconductor device 10*a* according to the present second embodiment will be described with reference to FIG. 12.

Figure 12:
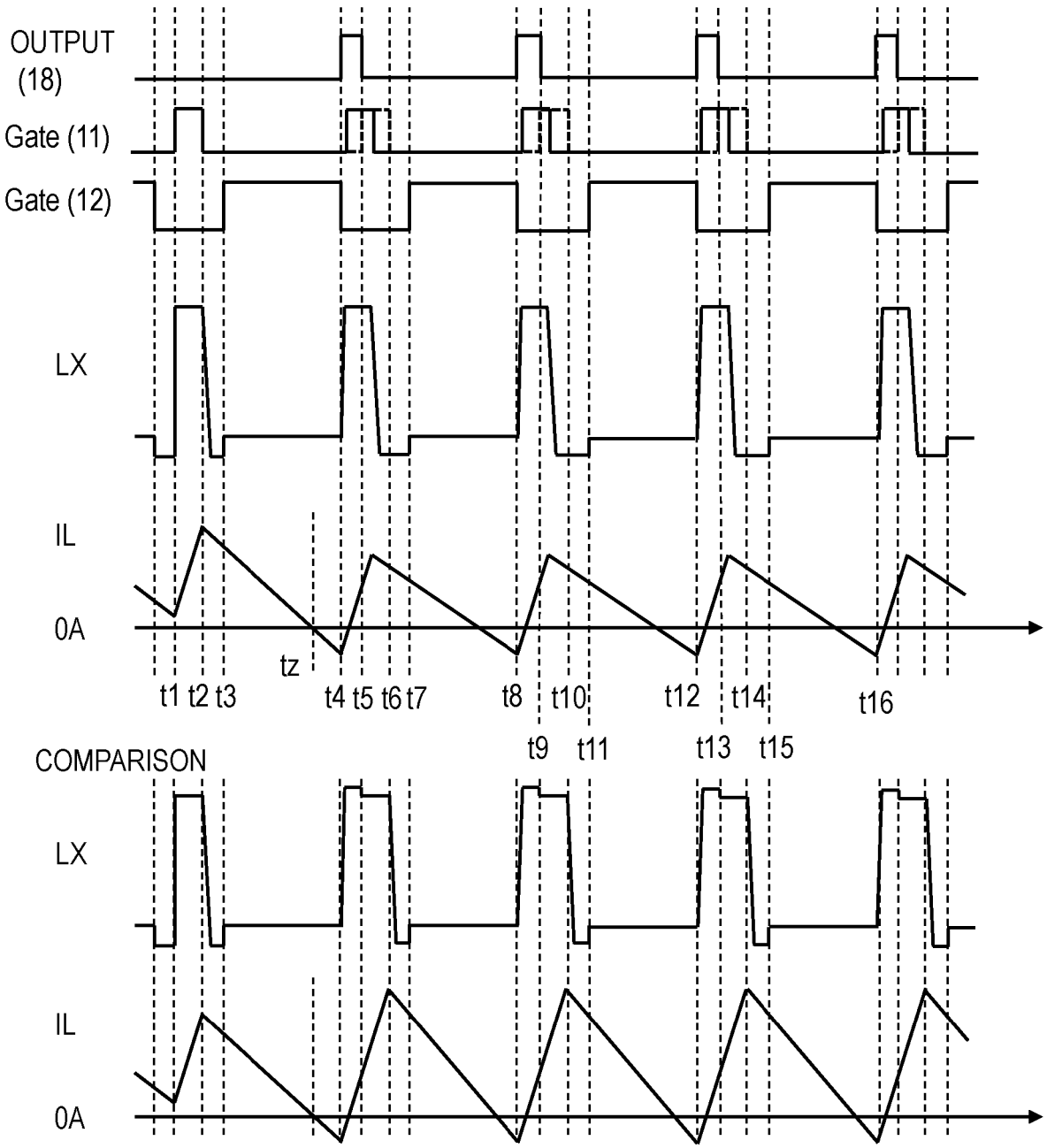
FIG. 12 is a timing chart for explaining the operation of semiconductor device according to second embodiment.

FIG. 12, similarly to FIG. 10, is a timing chart showing a case where the load current is reduced, and the reverse current is generated. The time from t1 to t4 in FIG. 12 is the same as the time from t1 to t4 in FIG. 10, and therefore description thereof is omitted. When the reverse current monitoring circuit 18 detects the reverse current, it outputs a logic value 1 (time t4). When the reverse current monitoring circuit 18 detects the reverse current, the shift circuit 26 shifts the PWM signal generated by the PWM control circuit 15 by a predetermined amount. As shown in FIG. 12, although the gate signal of the high-side switch 11, originally, should be Hi at time t5-t6 (the waveform of the dotted line), it is shifted to a predetermined amount earlier time (from time t5 to near time t4).

Since the gate signal of the high-side switch 11 becomes Hi from near time t4, the voltage of the inductor L (the voltage of the inductor connection terminal LX) also becomes Hi. Further, since the gate signal of the high-side switch 11 becomes Lo in the vicinity between the time t5 and t6, the voltage of the inductor L is a voltage lower than the ground (the reason is as described above). When the gate signal of the low-side switch 12 is Hi, the voltage of the inductor L is a ground potential (time t7). Thereafter, the same operation is repeated.

Here, after the reverse current detection, the effect of shifting the PWM signal will be described. In the lower part of FIG. 12, (COMPARISON), the same timing chart as in FIG. 9 is shown as a comparative timing chart. In the time t4-t7 of COMPARISON, due to the effect of the reverse current, the period in which the voltage of the inductor connecting terminal LX is Hi is two cycles (t4-t6). On the other hand, in present second embodiment, the period in which the voltage of the inductor connecting terminal LX is Hi is about one cycle (from around time t4, near between t5 and t6). This indicates that the PWM control with suppressing the effect of reverse current can be realized.

Further, when compared with COMPARISON in terms of the current flowing through the inductor L, it can be seen that the wave height of the current IL (amplitude) is reduced. The smaller the wave height, the smaller the ripple can be.

In first embodiment, PWM-signal generation is stopped when the reverse current is detected. In present second embodiment, the same effects as those of first embodiment can be obtained by shifting the PWM signal by a predetermined amount when the reverse current is detected.

As described above, in the second embodiment, the PWM is shifted by a predetermined amount in response to the detection of the reverse current. Thus, it is possible to suppress the ripple increase in the voltage of the inductor LX connection terminal (output voltage).

Third Embodiment

Figure 13:
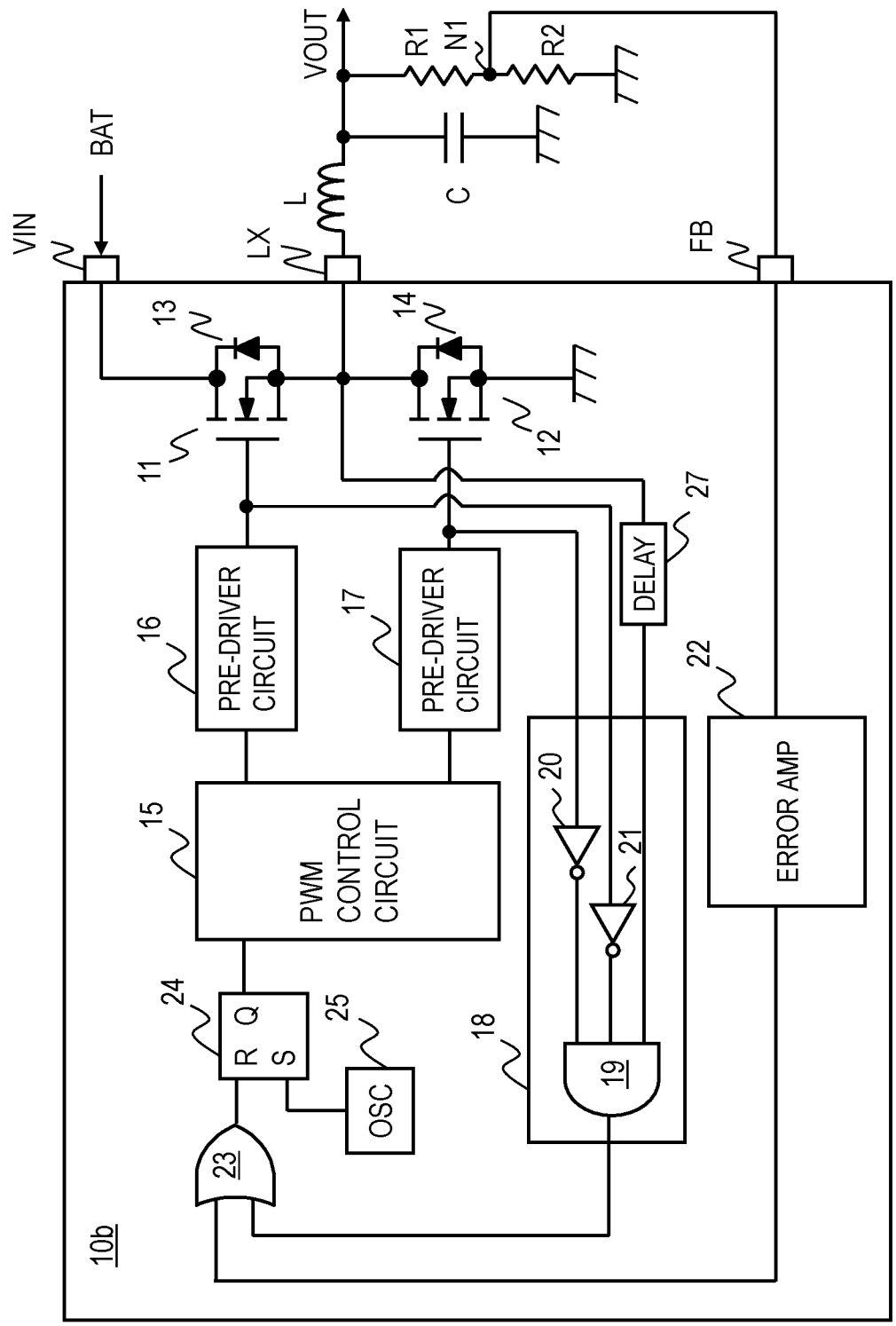
FIG. 13 is a diagram of a semiconductor device according to third embodiment.

FIG. 13 is a block diagram showing a configuration of a semiconductor device 10b according to third embodiment. The difference from first embodiment is that a DELAY 27 is added. By delay circuit 27 is added, a delayed waveform of the inductor connection terminal LX is input to the reverse current monitoring circuit 18.

Figure 14:
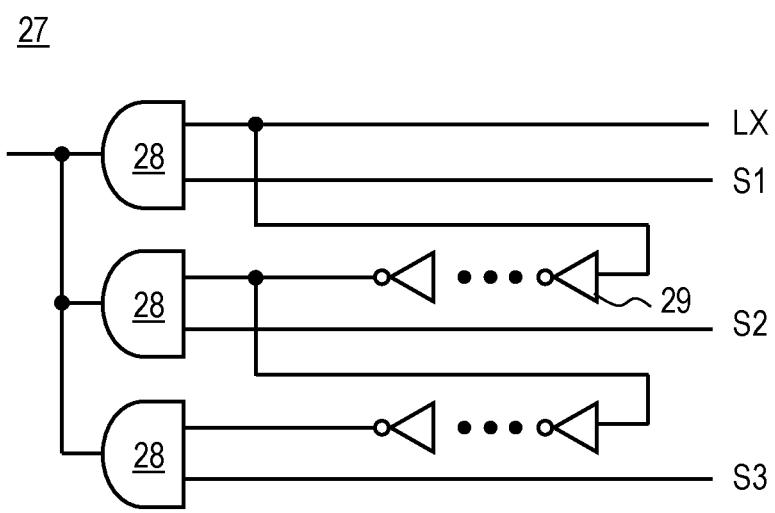
FIG. 14 is a block diagram of a delay circuit.

FIG. 14 is a diagram showing a configuration of the delay circuit 27. As shown in FIG. 14, the delay circuit 27 has three logical AND circuits 28 and multiple inverter circuits 29. One of the logical AND circuit 28 is connected to the Inductor connection terminal LX. The number of inverter circuits 29 corresponding to a predetermined delay value is connected to one end of each of the other two logical AND circuits 28. One of the selection signals S1 to S3 is connected to the other end of each of the AND circuits 28. Delay circuit 27, in accordance with the delay value selected by the selection signal S1-S3, delays the signal of the inductor connection terminal LX. The delay value is S3>S2>S1.

Figure 15:
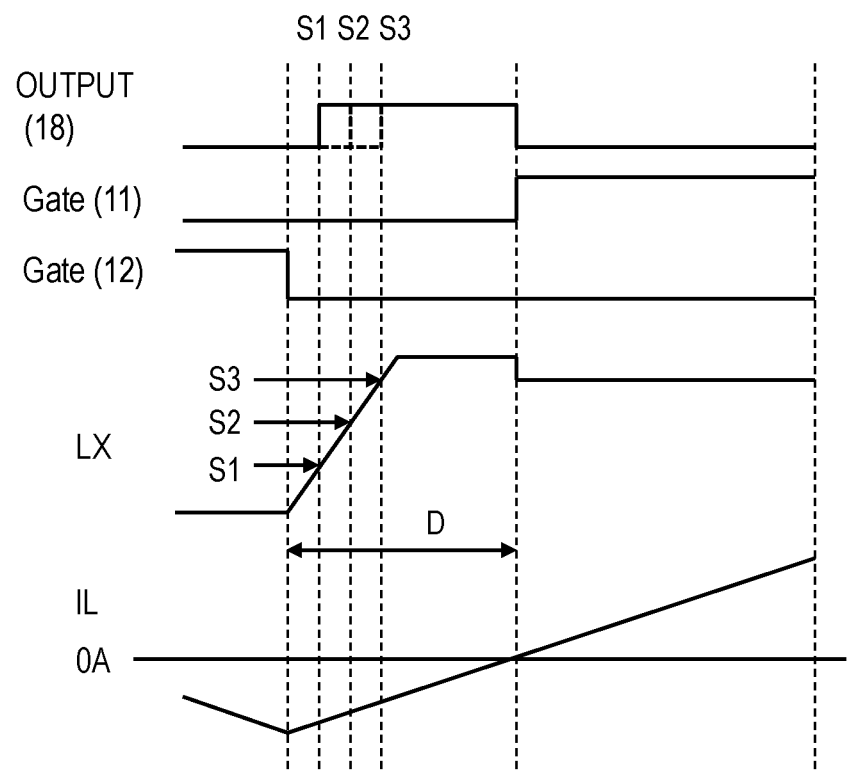
FIG. 15 is a timing chart for explaining the operation of semiconductor device according to third embodiment.

Next, the operation of semiconductor device 10b according to the third embodiment will be described. FIG. 15 is a timing chart for explaining the third embodiment, and corresponds to the timing chart obtained by enlarging the times t4 to t6 in FIG. 9.

First, a description will be given when the selection signal S1 is selected. When the selection signal S1 is selected, the delay circuit 27 outputs a signal of the inductor connection terminal LX with a minimum delay value. Output signal of the delay circuit 27 is input to the reverse current monitoring circuit 18. Reverse current monitoring circuit 18 determines whether the signal of the inductor connection terminal LX is Hi. This determination is determined by a threshold value of the logical AND circuit 19. For example, the logical AND circuit determines Hi at the timing shown in S1 in FIG. 15. As a result, the reverse current monitoring circuit 18 detects the occurrence of reverse current at timing S1. As described in first embodiment, when the reverse current monitoring circuit 18 detects the reverse current at timing S1, after S1, the generation of the PWM signal is masked. In the second embodiment, the PWM signal is shifted after S1.

Next, a description will be given of a case where the selection signal S2 is selected. When the selection signal S2 is selected, the delay circuit 27 outputs a signal of the inductor connection terminal LX with a delay value corresponding to S2. That is, the reverse current monitoring circuit 18 determines that the signal of the inductor connection terminal LX becomes Hi at the timing delayed from S1 by the amount of the delay value corresponding to S2. The timing determined to be Hi is denoted by S2 in FIG. 15. The same applies to the timing S3.

Reverse current monitoring circuit 18 detects the reverse current at the timing S1, S2 or S3. This means that the reverse current monitoring circuit 18 detects the reverse current at the timing S1 (arrow), S2 (arrow) or S3 (arrow) of the waveform of the inductor connection terminal LX that is not delayed.

As can be seen from the above description, the delay circuit 27 sets a reverse current value to detect the reverse current by the reverse current monitoring circuit 18. The selection signals S1 to S3 may be determined according to the load, and may be set by a CPU (not shown), for example.

As described above, the third embodiment can set the reverse current value for detecting the reverse current. Thus, the load current value (reverse current value) to set the PWM signal masking described in first embodiment and the PWM signal shifting described in second embodiment can be variable.

It should be noted that the present invention is not limited to the above-mentioned embodiments, and various modifications can be made without departing from the gist thereof.

What is claimed is:

1. A DC-DC converter, comprising:
   a high-side switch coupled between a first power supply and an output terminal;
   a low-side switch coupled between a second power supply and the output terminal;
   an inductor coupled to the output terminal;
   a reverse current monitoring circuit that determines that a reverse current from the inductor to the output terminal occurs when the output terminal becomes a high voltage during a state in which the high-side switch and the low-side switch are in a dead time; and
   a PWM control circuit that generates a PWM signal for controlling each of gates of the high-side switch and the low-side switch,
   wherein the reverse current monitoring circuit includes a logical-AND circuit, a first logical-NOT circuit, and a second logical-NOT circuit,
   wherein a gate signal of the high-side switch is inputted to the first logical-NOT circuit,
   wherein a gate signal of the low-side switch is inputted to the second logical-NOT circuit, and
   wherein outputs of the first logical-NOT circuit and the second logical-NOT circuit and the output terminal are coupled to the logical-AND circuit.

2. The DC-DC converter according to claim 1, wherein the PWM control circuit stops generating the PWM signal when the reverse current monitoring circuit detects the reverse current.

3. The DC-DC converter according to claim 1, wherein when the reverse current monitoring circuit detects the reverse current, a timing of the PWM signal generated by the PWM control circuit is shifted before a predetermined amount.

4. The DC-DC converter according to claim 1, further comprising:
   a delay circuit disposed between the output terminal and the logical-AND circuit.

5. The DC-DC converter according to claim 4,
   wherein the delay circuit has a plurality of delay values, and
   wherein one of the delay values is selected by a selection signal.

6. The DC-DC converter according to claim 1, further comprising:
   an RS latch circuit, wherein output of the logical-AND circuit is coupled to a reset terminal of the RS latch circuit.

7. The DC-DC converter according to claim 6, wherein the PWM control circuit stops generating the PWM signal when the RS latch circuit outputs a logic value 0.

8. The DC-DC converter according to claim 6, wherein when the RS latch circuit outputs a logic value 0, a timing of the PWM signal generated by the PWM control circuit is shifted before a predetermined amount.

\* \* \* \* \*